United States Patent [19]

Borsboom

[11] Patent Number: 5,677,629
[45] Date of Patent: Oct. 14, 1997

[54] RF COIL FOR TRANSMITTING/RECEIVING A BROAD SPECTRUM OF ELECTROMAGNETIC ENERGY

[75] Inventor: Heinrich M. Borsboom, Pijnacker, Netherlands

[73] Assignee: U. S. Philips Corporation, New York, N.Y.

[21] Appl. No.: 508,289

[22] Filed: Jul. 27, 1995

[30] Foreign Application Priority Data

Jul. 28, 1994 [EP] European Pat. Off. ............ 94202206

[51] Int. Cl.$^6$ .................................................. G01R 33/34
[52] U.S. Cl. ............................................................ 324/318
[58] Field of Search ................................. 324/300, 307, 324/309, 316, 318, 322; 128/653.2, 653.5

[56] References Cited

U.S. PATENT DOCUMENTS

| | | | |
|---|---|---|---|
| 4,467,282 | 8/1984 | Siebold | 324/309 |
| 4,649,348 | 3/1987 | Flugan | 324/318 |
| 4,712,067 | 12/1987 | Roschmann et al. | 324/318 |
| 4,763,074 | 8/1988 | Fox | 324/314 |
| 4,998,066 | 3/1991 | Wichern et al. | 324/322 |
| 5,196,796 | 3/1993 | Misic et al. | 324/322 |
| 5,521,506 | 5/1996 | Misic et al. | 324/322 |

FOREIGN PATENT DOCUMENTS

| | | |
|---|---|---|
| 0141383 | 5/1985 | European Pat. Off. . |
| 0409292 | 1/1991 | European Pat. Off. . |

*Primary Examiner*—Sandra L. O'Shea
*Assistant Examiner*—Roger Phillips
*Attorney, Agent, or Firm*—Jack D. Slobod

[57] ABSTRACT

The apparatus including a mainly cylindrical RF coil (9) having a central axis (33) which extends in its longitudinal direction, which coil has a number of axial conductor elements (35) which extend parallel to the central axis across a mainly cylindrical surface, and end conductor elements (37) which extend around the central axis near the ends of the axial conductor elements. The axial conductor elements (35) extend pair-wise diametrically relative to the central axis and the RF coil (9) is arranged to generate a substantially cosinusoidal current distribution as a function of the position of the axial conductor elements on the circumference of the cylinder in order to enable generation and/or reception of a substantially uniform RF magnetic field which is oriented perpendicularly to the cylinder axis. Each of the end conductor elements (37) consists of a number of loop conductor segments (39) which corresponds to the number of pairs of axial conductor elements (35). Each loop conductor element extends through an arc of 180° about the central axis (33) and electrically interconnects corresponding ends of a pair of axial conductor elements which are diametrically situated relative to the central axis. In conjunction with the loop conductor segments (39) connected to their ends, each pair of axial conductor elements (35) constitutes a coil element (41) which is composed of a number of turns of an elongate electrical conductor. The designer has great freedom as regards the choice of the self-inductance of the coil elements (41), and hence as regards the choice of the resonance frequency of the RF coil (9).

20 Claims, 4 Drawing Sheets

RF COIL FOR TRANSMITTING/RECEIVING A BROAD SPECTRUM OF ELECTROMAGNETIC ENERGY

BACKGROUND OF THE INVENTION

1. Field of Invention

The invention relates to a magnetic resonance apparatus, including a mainly cylindrical RF coil which has a central axis extending in its longitudinal direction and having a number of axial conductor elements which extend parallel to the central axis across a mainly cylindrical surface, and also end conductor elements which extend around the central axis near the ends of the axial conductor elements, the axial conductor elements extending pair-wise diametrically relative to the central axis, the coil being arranged to generate a substantially cosinusoidal current distribution as a function of the position of the axial conductor elements on the circumference of the cylinder in order to enable a substantially uniform RF magnetic field, oriented perpendicularly to the cylinder axis, to be generated and/or received.

2. Description of the Related Art

An example of such a magnetic resonance apparatus is known from EP-B-0 141 383. Capacitive elements are included in the axial conductor elements in the known apparatus. The RF coil can be represented as a ladder network consisting of a number of identical elements, each of which comprises a combination of self-inductances and capacitances. The values of the capacitances are determined mainly by the values of the capacitors included in the axial conductor elements, the values of the self-inductances being determined mainly by the self-inductances of the conductors constituting the RF coil and by the mutual inductances between these conductors. The resonance frequency of the ladder network, determining the frequency at which the RF coil can be used, can be determined by the designer by way of a suitable choice of the values of the capacitances and the self-inductances in said elements of the network. As is known, the resonance frequency is inversely proportional to the square root of the product of the self-inductance and the capacitance. In the known apparatus the range of values wherefrom the resonance frequency can be chosen is limited because the value of the capacitance cannot be arbitrarily high and with given dimensions of the RF coil the value of the self-inductance is substantially impossible to vary. As a result, the known apparatus is not suitable for so-called low-field MRI wherein the RF coil must be tuned to a comparatively low frequency. Examinations utilizing the so-called Overhauser effect also use low frequencies; for example, see EP-A-0 409 292. For such measurements the desired resonance frequency of the RF coil may be of the order of magnitude of some hundreds of kHz.

SUMMARY OF THE INVENTION

It is an object of the invention to provide an apparatus of the kind set forth in which the resonance frequency of the RF coil can be chosen comparatively independently of the dimensions of this coil, so that comparatively low resonance frequencies are also possible. To achieve this, the apparatus in accordance with the invention is characterized in that each of the end conductor elements consists of a number of loop conductor segments which corresponds to the number of pairs of axial conductor elements, each loop conductor segment extending through an arc of 180° around the central axis and electrically interconnecting corresponding ends of a pair of axial conductor elements diametrically situated relative to the central axis, each pair of axial conductor elements constituting, in conjunction with the loop conductor segments connected to their ends, a coil element composed of a number of turns of an elongate electric conductor. As a result of these steps, the self-inductance of the coil elements can be chosen comparatively arbitrarily by varying the number of turns of the conductor. The conductor may be, for example a conductor track on an electrically insulating substrate, so that the coil elements can be manufactured by means of a method known, for example for printed circuit boards (PCBs). An even higher flexibility as regards the number of turns, and hence the value of the self-inductance, however, is achieved in a preferred embodiment which is characterized in that each of the coil elements is formed as a self-supporting, substantially saddle-shaped coil wound from an electrically conductive wire provided with an electrically insulating sheath.

In order to tune the RF coil to a given resonance frequency and to obtain the desired cosinusoidal current distribution, not only the self-inductances of the coil elements are required, but also capacitive elements. Therefore, a further preferred embodiment of the apparatus in accordance with the invention is characterized in that the coil elements are electrically connected in series, that each junction point between two successive coil elements in the series connection as well as the starting point and the end point of the series connection are connected to a common ground connection via a capacitive element, the starting point and the ground connection constituting a first and a second coil connection, respectively, and being electrically connected to respective connections of an RF transmitter and/or receiver device. For a given self-inductance of the coil elements, the resonance frequency can be adjusted by a suitable choice of the values of the impedances. A very simple version of this embodiment is characterized in that each of the capacitive elements is formed by a capacitor, the capacitances of the capacitors connected to the junction points being identical and twice as high as the capacitances of the capacitors connected to the starting point and the end point. Another very simple version is characterized in that each of the capacitive elements is formed by a capacitor, the capacitances of the capacitors being identical.

As has already been stated, the RF coil serves to generate and/or receive a substantially uniform magnetic field which is oriented perpendicularly to the cylinder axis. To this end, the current in the axial conductor elements is proportional to the cosine of an angle $\theta$ indicating the position of each axial conductor element on the circumference of the cylinder. The current through the end conductor elements, however, generates a magnetic field which is oriented approximately parallel to the axis of the cylinder. In order to minimize this disturbing magnetic field, a further preferred embodiment of the apparatus in accordance with the invention is characterized in that the coil elements are arranged around the cylinder axis in such a manner that loop conductor segments which belong to different coil elements, are situated at the same end of the cylinder, and are connected to the axial conductor elements which, considering the cosinusoidal current distribution, are arranged to carry the same or substantially the same currents, carry currents of opposite directions in the operating condition. As a result of the cosinusoidal current distribution, the axial conductor elements which carry the same or substantially the same currents in the operating condition are situated near one another on the cylinder circumference. The loop conductor segments connected to these axial conductor elements overlap one another over a part of the cylinder circumference and, evidently, the current intensities in these loop conductor segments are also equal or substantially equal. Because these current intensities are oppositely directed, the axially directed magnetic fields generated thereby will compensate one another, so that the ultimately remaining, axially directed disturbing magnetic field is minimized.

In the ideal case the current in the axial direction would have to be continuously sinusoidally distributed across the cylinder circumference. However, this would mean that the cylinder should have a substantially closed electrically conductive surface all around. It is difficult to construct such a surface and, moreover, a closed RF coil is very annoying to a patient to be examined. To this end, the cosinusoidal current distribution is approximated in practice by means of a finite number of axial conductor elements. A suitable approximation is achieved when the RF coil comprises at least four coil elements which are uniformly distributed across the circumference of the cylinder. The number of axial conductor elements then equals eight.

In many cases rotation of the transmitted and/or received RF magnetic field is desirable. In such cases a so-called quadrature coil system is often used, which system comprises two RF coils which generate and/or receive mutually perpendicularly directed RF magnetic fields which are excited and/or read out with a mutual phase difference of 90°. An embodiment of the apparatus in accordance with the invention which is suitable for this purpose is characterized in that the apparatus comprises a first and a second RF coil, the first and second RF coils essentially having the same construction and being concentrically arranged in such a manner that relative to the first coil connection of the first RF coil the first coil connection of the second RF coil has been rotated through an angle of 90° about the cylinder axis, and that the first coil connections of the first and the second RF coil are connected to respective connections of the RF transmitter and/or receiver device which are arranged to supply and/or receive RF signals with a mutual phase difference of 90° in order to enable mutually perpendicularly oriented RF magnetic fields with a phase difference of 90°to be generated and/or received. A further suitable embodiment is characterized in that the RF coil is composed of 2n electrically series-connected coil elements, n being an even, positive number, that the starting point of the series connection is electrically connected to the end point, that each junction point between two coil elements is connected, via a mainly capacitive element, to a common ground connection, that each time two coil elements having the sequence numbers i and n+i in the series connection are wound one over the other, where $1 \leq i \leq n$, that the RF coil comprises first, second and third coil connections which are formed by the starting point, the junction point between the coil elements having the sequence numbers n/2 and n/2+1, and the ground connection, respectively, and that the first and second coil connections are connected to respective connections of the RF transmitter and/or receiver device which are arranged to supply and/or receive RF signals with a mutual phase difference of 90° in order to enable mutually perpendicularly oriented RF magnetic fields with a phase difference of 90° to be generated and/or received.

BRIEF DESCRIPTION OF THE DRAWING

These and other aspects of the invention will be described in detail hereinafter with reference to the drawing, wherein.

DETAILED DESCRIPTION OF THE PREFERRED EMBODIMENTS

Figure 1:
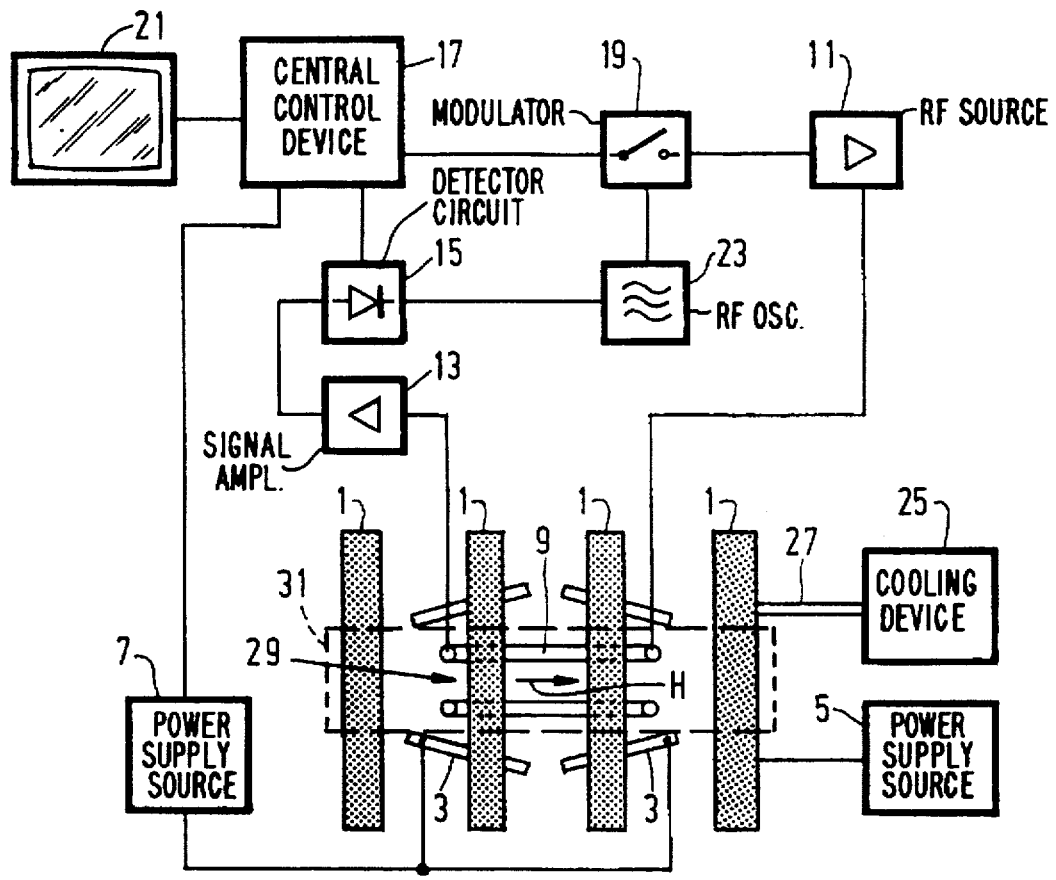
FIG. 1 shows diagrammatically an embodiment of a magnetic resonance apparatus in accordance with the invention.

The magnetic resonance apparatus which is diagrammatically shown in FIG. 1 comprises a first magnet system 1 for generating a steady magnetic field H, a second magnet system 3 for generating magnetic gradient fields, and first and second power supply sources 5 and 7 for the first magnet system 1 and the second magnet system 3, respectively. A radio frequency (RF) coil 9 serves to generate an RF magnetic alternating field; to this end, it is connected to an RF source 11. The RF coil 9 can also be used for detection of spin resonance signals generated by the RF transmitted field in an object to be examined (not shown); to this end, it is connected to a signal amplifier 13. The output of the signal amplifier 13 is connected to a detector circuit 15 which is connected to a central control device 17. The central control device 17 also controls a modulator 19 for the RF source 11, the second power supply source 7 and a monitor 21 for display. An RF oscillator 23 controls the modulator 19 as well as the detector 15 processing the measurement signals. For cooling, if any, of the magnet coils of the first magnet system 1 there is provided a cooling device 25 comprising cooling ducts 27. The RF coil 9, arranged within the magnet systems 1 and 3, encloses a measurement space 29 which is large enough to accommodate a patient to be examined, or a part of the patient to be examined, for example the head and the neck, in an apparatus for medical diagnostic measurements. Thus, a steady magnetic field H, gradient fields selecting object slices, and a spatially uniform RF alternating field can be generated within the measurement space 29. The RF coil 9 can combine the functions of transmitter coil and measuring coil. Alternatively, different coils can be used for the two functions, for example measuring coils in the form of surface coils. Hereinafter, the RF coil 9 will usually be referred to only as the transmitter coil. For the use of the coil as a measuring coil the same considerations apply in accordance with the reciprocity theorem. If desired, the coil 9 may be enclosed by an RF field shielding Faraday cage 31.

Figure 2:
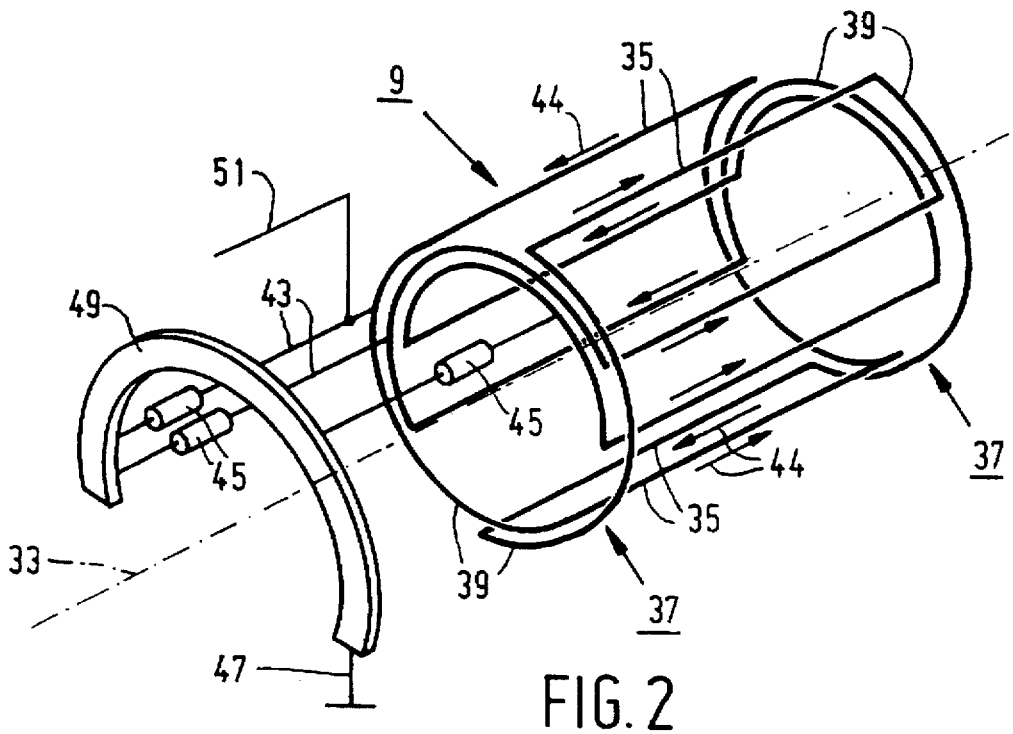
FIG. 2 is a perspective view of an embodiment of an RF coil for the device shown in FIG. 1.

FIG. 2 is a perspective view of the construction of an embodiment of the RF coil 9. The RF coil 9 is shaped mainly as a straight circular cylinder having a central axis 33 extending parallel to the direction of the steady magnetic field H in the operating condition (see FIG. 1). The RF coil 9 comprises a number of axial conductor elements 35 which extend parallel to the axis 33 and which are regularly distributed across the cylinder surface in such a manner that diametrically opposite each axial conductor element another axial conductor element extends. Two axial conductor elements 35 extending diametrically relative to the axis 33 together constitute a pair. Near the ends of the axial conductor elements 35 there are situated end conductor elements 37 which extend around the central axis 33 and which are composed of loop conductor segments 39. Each of the loop conductor segments 39 extends through an arc of 180° around the axis 33 and interconnects corresponding ends of a pair of axial conductor elements 35 situated diametrically relative to the axis. In conjunction with the two loop conductor segments interconnecting their ends, each pair of axial conductor elements 35 constitutes a coil element 41 which will be described in detail hereinafter with reference to FIG. 3.

Figure 3:
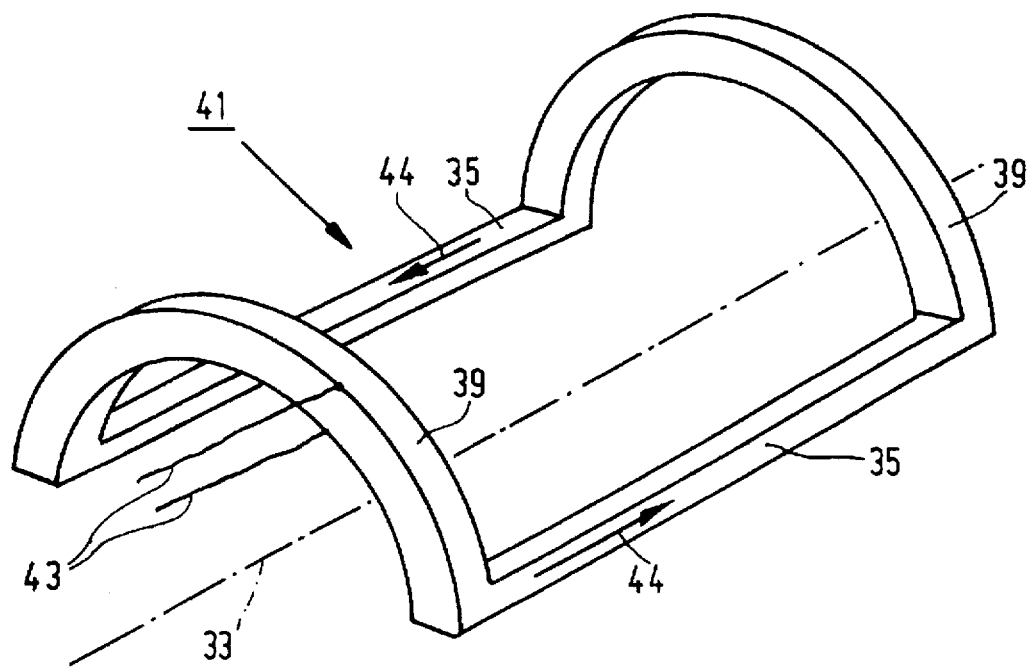
FIG. 3 is a perspective view at an enlarged scale of a coil element of the RF coil shown in FIG. 2.

FIG. 3 is a perspective view of a coil element 41 at a scale larger than that of FIG. 2. The present embodiment of the coil element 41 is formed as a self-supporting, substantially saddle-shaped coil wound from electrically conductive wire. The wire may be of a type commonly used for the winding of coils, for example single copper wire or litz wire provided with an electrically insulating lacquer or enamel layer. After winding, the shape of the coil element is stabilized, for example by impregnation or by heating of the lacquer layer. The free ends of the wire are fed out as connection conductors 43. The coil element 41 can also be wound on a coil former or be constructed as surface wiring on an electrically insulating substrate. The current directions in the axial conductor elements 35 of each coil element 41 are opposed as denoted by the arrows 44. Furthermore, the RF coil 9 is arranged so that the current distribution as a function of the position of the axial conductor elements 35 on the circumference of the cylinder is substantially cosinusoidal.

The connection conductors 43 of the various coil elements 41 constituting the RF coil 9 are connected, via capacitive elements 45, to a metal ring segment 49 (see FIG. 2) which is grounded at 47 and which constitutes a common ground connection. FIG. 2 shows only three capacitive elements 45 in order to keep the figure simple. In reality the number of capacitive elements will be larger as will be described with reference to the circuit diagram shown in FIG. 5. One of the connection conductors 43 is connected, via a connection cable 51, to the RF source 11 and/or the signal amplifier 13.

Figure 4:
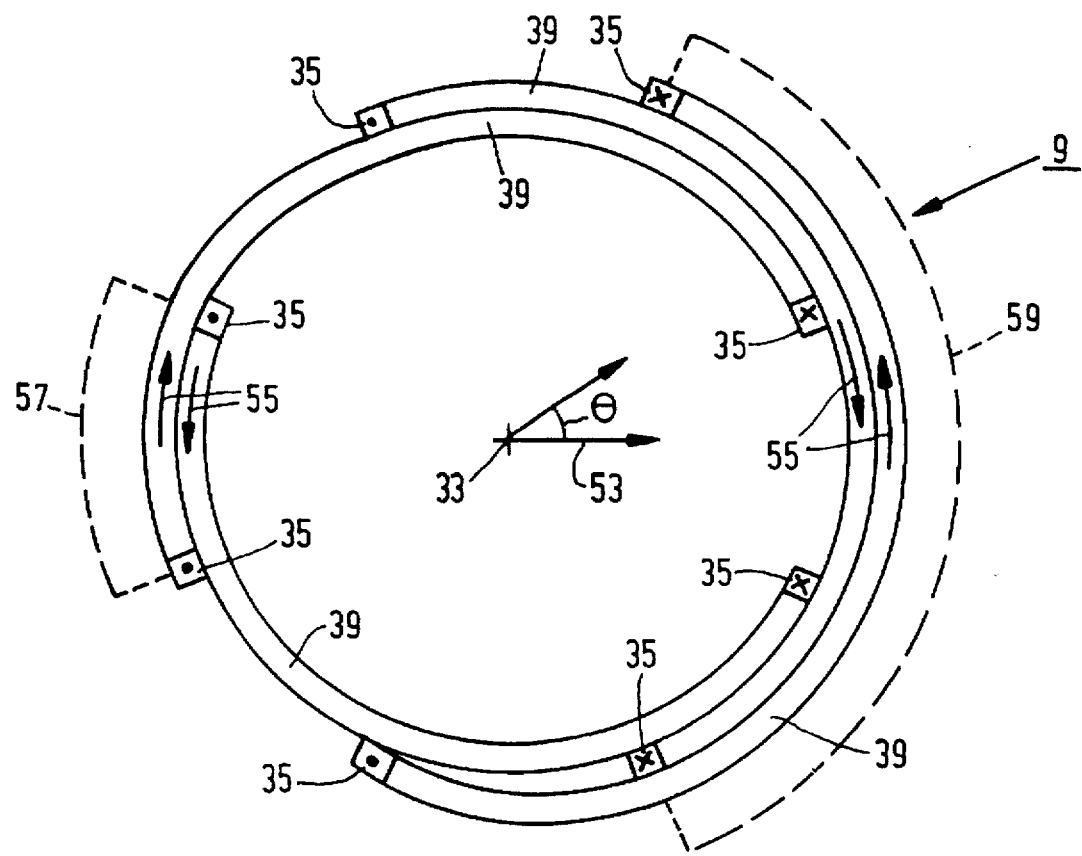
FIG. 4 is a diagrammatic axial view of an RF coil of the type shown in FIG. 2.

FIG. 4 is an end view in the axial direction of an RF coil 9 of the type described with reference to the FIGS. 2 and 3. The RF coil 9 comprises four coil elements 41 whose loop conductor segments 39 which are situated at one end are visible in FIG. 4. The associated axial conductor elements 35 are indicated in this figure, the current direction in each axial conductor element being indicated in a conventional manner: a dot means that at a given instant the current is directed towards the viewer and a cross means that the current is directed away from the viewer at that instant. As has already been stated, the current distribution is cosinusoidal. This means that the current intensity in an arbitrary axial conductor element 35 is proportional to cos θ at any instant, θ being the angle indicating the position of the relevant axial conductor element on the circumference of the cylinder relative to a zero position denoted by the arrow 53. In the example shown, the first axial conductor element 35 is situated in a position for which θ=22.5°; a next conductor element is provided every 45°. The absolute value of the current intensity in the axial conductor elements 35 for which cos θ has the same absolute value is the same. The associated current directions in the loop conductor segments 39 are denoted by arrows 55. The loop conductor segments 39 which are associated with different coil elements 41 and which are connected to axial conductor elements 35 for which cos θ has the same value carry the same current intensity. The coil elements 41 are arranged around the cylinder axis 33 in such a manner that, when situated at the same end of the cylinder, these loop conductor segments carry currents of opposite directions. Consequently, the magnetic fields produced by these currents and extending parallel to the cylinder axis 33 compensate one another over a part of the circumference of the end conductor element 37 formed by the loop conductor segments 39 (see FIG. 2). The areas in which such compensation takes place are denoted by dashed arcs 57 and 59 in FIG. 4. Outside these areas, however, the currents in the loop conductor segments 39 produce an axial magnetic field. However, it will be readily understood that these fields are oppositely directed for parts of the loop conductor segments 39 situated diametrically relative to the axis 33. As a result, they will substantially cancel one another at least in the vicinity of the axis 33.

Figure 5:
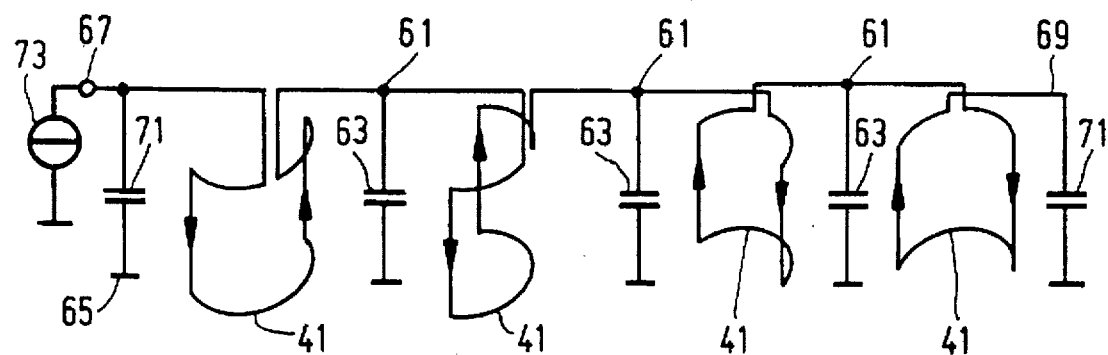
FIG. 5 shows an example of a circuit diagram of the RF coil shown in FIG. 2.

FIG. 5 shows a circuit diagram of an RF coil of the type shown in FIG. 2. The four coil elements 41 are electrically connected in series and each junction point 61 between two successive coil elements in the series connection is connected, via one of the capacitive elements shown in FIG. 2, being a capacitor 63 in the present case, to a common ground connection 65 which is preferably formed by the ring segment 49 shown in FIG. 2. The starting point 67 and the end point 69 of the series connection are also connected to the ground connection 65 via a respective capacitor 71. The capacitances of said capacitors 63 are equal to an amount being twice the capacitances of the capacitors 71. The starting point 67 and the ground connection 65 constitute first and second coil connections, respectively. Each of these points is connected to one of the connections of the RF transmitter device 11 and/or the RF receiver device 13, represented in the diagram by a current source 73. The network thus formed behaves as a low-pass filter. It is essentially a "lumped element transmission line" having a length of one half wavelength, i.e. between the starting point 67 and the end point 69 the amplitude of the current through the axial conductor elements 35 varies according to the cosine of an angle proportional to the distance from the starting point. At the starting point 67 this angle has the value zero and at the end point 69 it equals 180°, corresponding to one half wavelength. Because each of the axial conductor elements 35 is connected, via the associated loop conductor segments 39, to a conductor element which is diametrically situated relative to the central axis 33, the desired cosinusoidal current distribution is thus achieved across the entire circumference of the RF coil 9. As a result, an RF coil constructed as a transmission line of one half wave length is suitable to generate a linearly polarized RF magnetic field. It is to be noted that a linearly polarized RF magnetic field can also be generated by an RF coil constructed as a transmission line having a length of a full wavelength. The circuit diagram of such a coil deviates from the diagram shown in FIG. 5 merely in that the number of coil elements (for an equally accurate approximation of the desired RF magnetic field) is twice as large and in that the capacitors 63 have the same value as the capacitors 71.

Figure 6:
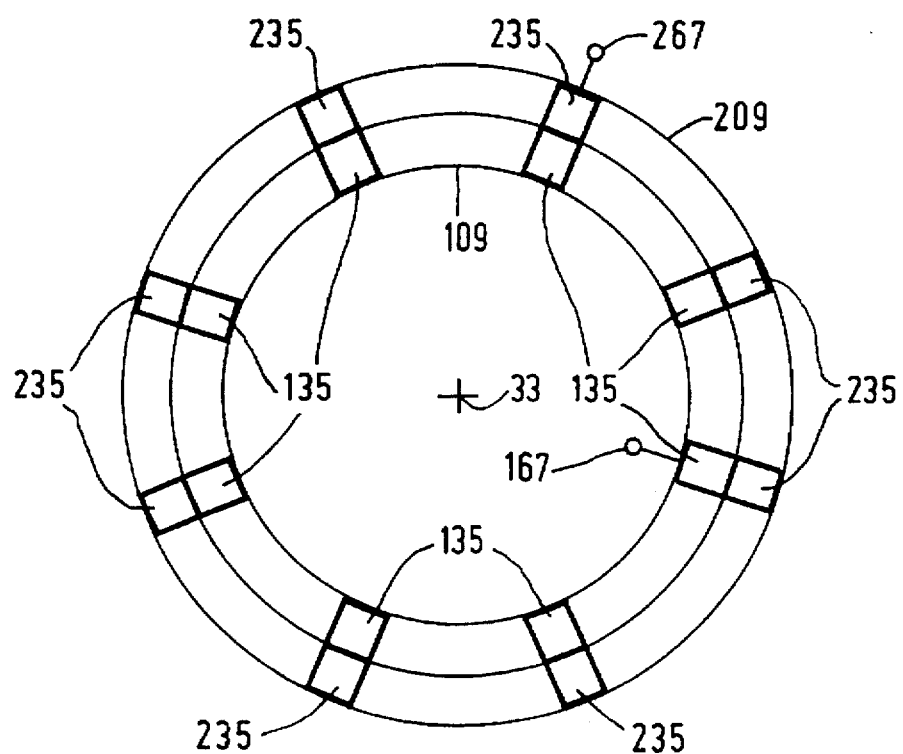
FIG. 6 is a diagrammatic axial view of a first embodiment of a quadrature coil system suitable for the apparatus shown in FIG. 1.

FIG. 6 is a diagrammatic end view in the axial direction of a combination of a first and a second RF coil as can be used in the apparatus shown in FIG. 1. The first RF coil 109 is concentrically enclosed by the second RF coil 209, so that the two RF coils have the same central axis 33. The first and second RF coils 109 and 209 essentially have the same construction as the previously described RF coil 9. The second RF coil 209, however, has a diameter which is so much larger than that of the first RF coil 109 that the two coils can be arranged one exactly in the other. The RF coils 109 and 209 are oriented in such a manner that the axial conductor elements 135 of the first RF coil are situated in the same angular positions on the cylinder surface as the axial conductor elements 235 of the second RF coil, be it that the first coil connection 267 of the second RF coil has been rotated through an angle of 90° about the cylinder axis 33 relative to the first coil connection 167 of the first RF coil. An equivalent combination of first and second RF coils 109 and 209 can be obtained by simultaneously winding correspondingly situated coil elements of the two RF coils by means of two separate conductors. In that case the first and second RF coils 109 and 209 will have substantially the same diameter.

Figure 7:
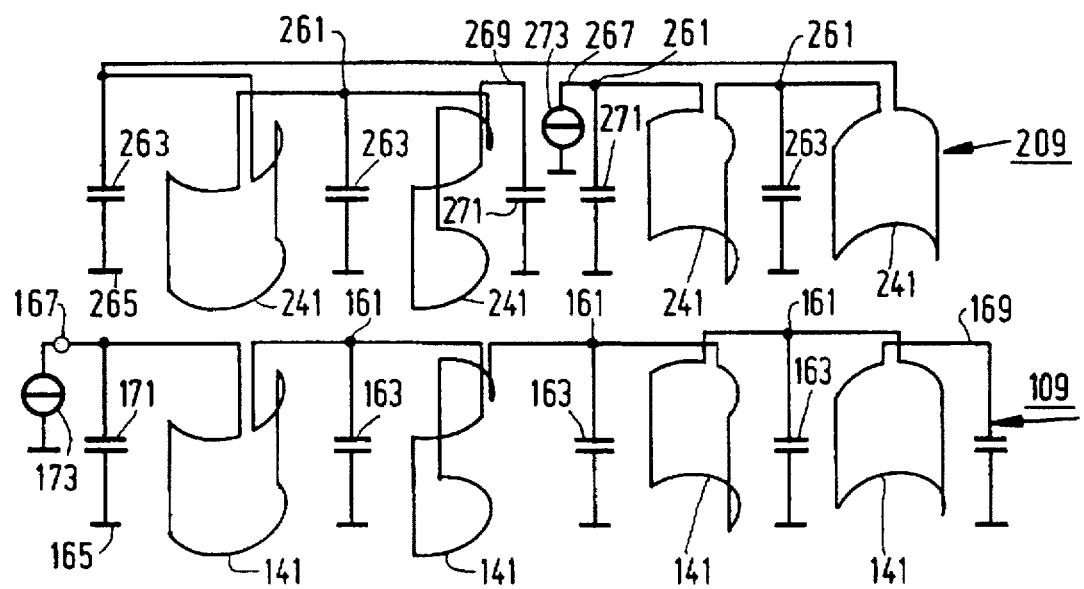
FIG. 7 shows a circuit diagram for the quadrature coil system shown in FIG. 6.

FIG. 7 shows a circuit diagram of the combination of first and second RF coils 109 and 209 shown in FIG. 6. The diagram for the first RF coil 109 corresponds exactly to the diagram shown in FIG. 5 and corresponding elements are denoted by the corresponding reference numerals increased by 100. The diagram for the second RF coil 209 is composed in such a manner that coil elements 241 of the second RF coil and coil elements 141 of the first RF coil 109 which occupy the same positions on the cylinder surface are shown one directly above the other in the figure. Therefore, the first coil connection 267 of the second RF coil 209, rotated through 90° with respect to the first coil connection 167 of the first RF coil 109 as described above, is situated approximately midway the circuit diagram. For the remainder the diagram for the second RF coil 209 is also the same as the diagram shown in FIG. 5. Corresponding elements are denoted by corresponding reference numerals increased by 200.

The first coil connection 167 of the first RF coil 109 is connected to a first current source 173 and the first coil connection 267 of the second RF coil 209 is connected to a second current source 273. The first and second current sources 173 and 273 represent first and second connections of an RF transmitter and/or receiver device which are arranged to supply and/or receive RF signals with a mutual phase difference of 90°. The transmitter and receiver devices may be of the type indicated in FIG. 1 in which the output of the RF source 11, or the input of the signal amplifier 13, is connected to a hybrid network (not shown) which is known per se. The first and second RF coils 109 and 209 thus connected to an RF transmitter and/or receiver device together constitute a quadrature coil system which is capable of generating and/or receiving mutually perpendicularly oriented RF magnetic fields with a phase difference of 90°. A circularly polarized RF magnetic field can thus be generated.

Figure 8:
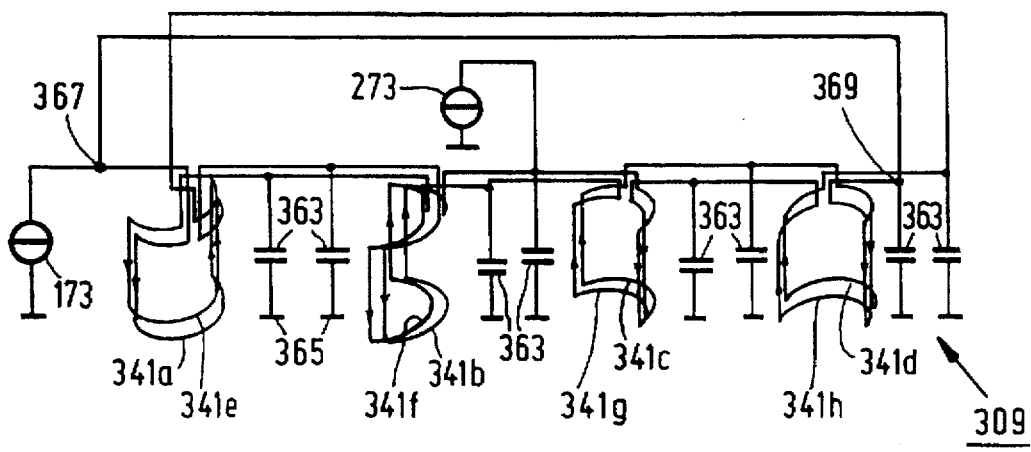
FIG. 8 shows a circuit diagram for a second embodiment of a quadrature coil system suitable for the apparatus shown in FIG. 1.
Figure 9:
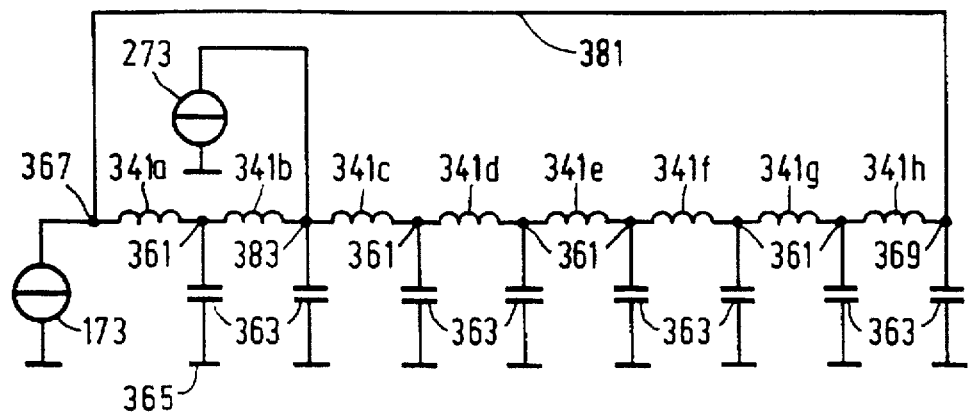
FIG. 9 is a simplified representation of the circuit shown in FIG. 8.

FIG. 8 shows a circuit diagram of a second embodiment of a quadrature coil system suitable for use in the apparatus shown in FIG. 1, and FIG. 9 shows a simplified version of the same circuit diagram. The quadrature coil system of the present embodiment comprises an RF coil 309 which is constructed as a single, consecutively wound coil. The construction of the RF coil 309 in principle corresponds to the construction of the RF coil 9 shown in FIG. 2. However, the RF coil 309 is composed of eight electrically series-connected coil elements 341a, ... 341h. Each time two coil elements are wound one on the other, the sequence numbers of said two coil elements differing each time by four in the series connection, for example the coil elements 341a and 341e. The coil elements wound onto one another are shown one on top of the other in FIG. 8. Because the interconnections are thus less clear in FIG. 8, for the sake of clarity FIG. 9 shows a simplified diagram in which the coil elements are consecutively shown in a conventional manner. The starting point 367 of the series connection is electrically connected to the end point 369 by way of a connection lead 381. Each junction point 361 between two successive coil elements 341a ... 341h, including the junction point established by the connection lead between the first coil element 341a and the last coil element 341h, is connected to a common ground connection 365 via a capacitor 363. The values of all capacitors 363 are the same. The starting point 367 constitutes a first coil connection of the RF coil and the junction point between the coil elements 341b and 341c, denoted by the reference 383, constitutes a second coil connection. The ground connection 365 constitutes a third coil connection. The first and second coil connections 367 and 383 are connected to respective current sources 173 and 273 which represent, in the same way as in FIG. 7, first and second connections of an RF transmitter and/or receiver device which are arranged to supply and/or receive RF signals with a mutual phase difference of 90°. The RF coil 309 then acts as a combination of two independent coils which together generate a rotating RF magnetic field.

The RF coil 309 of the embodiment shown in the FIGS. 8 and 9 comprises eight coil elements 341a ... 341h. Evidently, it is also possible to construct a quadrature coil system with an RF coil which is constructed in the same manner but comprises a different number of coil elements, provided that this number equals 2n, n being an arbitrary positive, even number. In that case each time two coil elements having the sequence numbers i and n+i in the series connection will be wound one over the other, where $1 \leq i \leq n$. The second coil connection 383 is then formed by the junction point between the coil elements having the sequence numbers n/2 and n/2+1.

I claim:

1. A magnetic resonance apparatus, comprising a mainly cylindrical RF coil which has a central axis extending in its longitudinal direction and comprises a plurality of pairs of axial conductor elements which extend parallel to the central axis across a mainly cylindrical surface, and also comprises end conductor elements which extend around the central axis near the ends of the axial conductor elements, the axial conductor elements of each pair extending diametrically relative to the central axis, the coil being arranged to generate a substantially cosinusoidal current distribution as a function of the position of the axial conductor elements on the circumference of the cylinder in order to enable a substantially uniform RF magnetic field, oriented perpendicularly to the cylinder axis, to be generated and/or received, wherein each of the end conductor elements consists of a number of loop conductor segments which corresponds to the number of pairs of axial conductor elements, each loop conductor segment extending through an arc of 180° around the central axis and electrically interconnecting corresponding ends of a pair of axial conductor elements diametrically situated relative to the central axis, each pair of axial conductor elements constituting, in conjunction with the loop conductor segments connected to their ends, a coil element composed of a number of turns of an elongate electric conductor.

2. A magnetic resonance apparatus as claimed in claim 1, wherein each of the coil elements is formed as a self-supporting, substantially saddle-shaped coil wound from an electrically conductive wire provided with an electrically insulating sheath.

3. A magnetic resonance apparatus as claimed in claim 1, wherein the coil elements are electrically connected in series, and each junction point between two successive coil elements in the series connection as well as a starting point and an end point of the series connection are connected to a common ground connection via a capacitive element, the starting point and the ground connection constituting a first and a second coil connection, respectively, and being electrically connected to respective connections of an RF transmitter and/or receiver device.

4. A magnetic resonance apparatus as claimed in claim 3, wherein each of the capacitive elements is formed by a capacitor, the capacitances of the capacitors connected to the junction points (61) being identical and twice as high as the capacitances of the capacitors connected to the starting point and the end point.

5. A magnetic resonance apparatus as claimed in claim 3, wherein each of the capacitive elements is formed by a capacitor, the capacitances of the capacitors being identical.

6. A magnetic resonance apparatus as claimed in claim 1 wherein the coil elements are arranged around the cylinder axis in such a manner that loop conductor segments which belong to different coil elements, are situated at the same end of the cylinder, and are connected to the axial conductor elements which, considering the cosinusoidal current distribution, are arranged to carry the same or substantially the same currents, carry currents of opposite directions in the operating condition.

7. A magnetic resonance apparatus as claimed in claim 1 wherein the RF coil comprises at least four coil elements which are uniformly distributed across the circumference of the cylinder.

8. A magnetic resonance apparatus as claimed in claim 3 wherein the apparatus comprises a first RF coil and a second RF coil, the first and second RF coils essentially having the same construction and being concentrically arranged in such a manner that relative to the first coil connection of the first RF coil the first coil connection of the second RF coil has been rotated, through an angle of 90° about the cylinder axis, and that the first coil connections of the first and the second RF coil are connected to respective connections of the RF transmitter and/or receiver device which are arranged to supply and/or receive RF signals with a mutual phase difference of 90° in order to enable mutually perpendicularly oriented RF magnetic fields with a phase difference of 90° to be generated and/or received.

9. A magnetic resonance apparatus as claimed in claim 6, wherein the RF coil is composed of 2n electrically series-connected coil elements, n being an even, positive number, wherein the starting point of the series connection is electrically connected to the end point, wherein each junction point between two coil elements is connected, via a capacitive element, to a common ground connection, wherein each time two coil elements having the sequence number i and n+i in the series connection are wound one over the other, where $1 \leq i \leq n$, wherein the RF coil comprises first, second and third coil connections which are formed by the starting point, the junction point between the coil elements having the sequence numbers n/2 and n/2+1, and the ground connection, respectively, and wherein the first and second coil connections are connected to respective connections of an RF transmitter and/or receiver device which are arranged to supply and/or to receive RF signals with a mutual phase difference of 90° in order to enable mutually perpendicularly oriented RF magnetic fields with a phase difference of 90° to be generated and/or received.

10. A magnetic resonance apparatus as claimed in claim 2, wherein the coil elements are electrically connected in series, and each junction point between two successive coil elements in the series connection as well as a starting point and an end point of the series connection are connected to a common ground connection via a capacitive element, the starting point and the ground connection constituting a first and a second coil connection, respectively, and being electrically connected to respective connections of an RF transmitter and/or receiver device.

11. A magnetic resonance apparatus as claimed in claim 2, wherein the coil elements are arranged around the cylinder axis in such a manner that loop conductor segments which belong to different coil elements, are situated at the same end of the cylinder, and are connected to the axial conductor elements which, considering the cosinusoidal current distribution, are arranged to carry the same or substantially the same currents, carry currents of opposite directions in the operating condition.

12. A magnetic resonance apparatus as claimed in claim 3, wherein the coil elements are arranged around the cylinder axis in such a manner that loop conductor segments which belong to different coil elements, are situated at the same end of the cylinder, and are connected to the axial conductor elements which, considering the cosinusoidal current distribution, are arranged to carry the same or substantially the same currents, carry currents of opposite directions in the operating condition.

13. A magnetic resonance apparatus as claimed in claim 10, wherein the coil elements are arranged around the cylinder axis in such a manner that loop conductor segments which belong to different coil elements, are situated at the same end of the cylinder, and are connected to the axial conductor elements which, considering the cosinusoidal current distribution, are arranged to carry the same or substantially the same currents, carry currents of opposite directions in the operating condition.

14. A magnetic resonance apparatus as claimed in claim 2, wherein the RF coil comprises at least four coil elements which are uniformly distributed across the circumference of the cylinder.

15. A magnetic resonance apparatus as claimed in claim 3, wherein the RF coil comprises at least four coil elements which are uniformly distributed across the circumference of the cylinder.

16. A magnetic resonance apparatus as claimed in claim 4, wherein the RF coil comprises at least four coil elements which are uniformly distributed across the circumference of the cylinder.

17. A magnetic resonance apparatus as claimed in claim 5, wherein the RF coil comprises at least four coil elements which are uniformly distributed across the circumference of the cylinder.

18. A magnetic resonance apparatus as claimed in claim 6, wherein the RF coil comprises at least four coil elements which are uniformly distributed across the circumference of the cylinder.

19. A magnetic resonance apparatus as claimed in claim 13, wherein the RF coil comprises at least four coil elements which are uniformly distributed across the circumference of the cylinder.

20. A magnetic resonance apparatus as claimed in claim 4, wherein the apparatus comprises a first RF coil and a second RF coil, the first and second RF coils essentially having the same construction and being concentrically arranged in such a manner that relative to the first coil connection of the first RF coil the first coil connection of the second RF coil has been rotated, through an angle of 90 about the cylinder axis, and that the first coil connections of the first and the second RF coil are connected to respective connections of the RF transmitter and/or receiver device which are arranged to supply and/or receive RF signals with a mutual phase difference of 90° in order to enable mutually perpendicularly oriented RF magnetic fields with a phase difference of 90° to be generated and/or received.

* * * * *